(12) United States Patent
You et al.

(10) Patent No.: US 9,893,134 B2
(45) Date of Patent: Feb. 13, 2018

(54) ORGANIC LIGHT-EMITTING DIODE DISPLAY

(71) Applicant: Samsung Display Co., Ltd., Yongin-si, Gyeonggi-do (KR)

(72) Inventors: Chun Gi You, Asan-si (KR); Gwang Geun Lee, Asan-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/150,064

(22) Filed: May 9, 2016

(65) Prior Publication Data

US 2016/0351645 A1    Dec. 1, 2016

(30) Foreign Application Priority Data

May 26, 2015    (KR) ......................... 10-2015-0073082

(51) Int. Cl.
*H01L 27/32* (2006.01)
*H01L 51/52* (2006.01)

(52) U.S. Cl.
CPC ........ *H01L 27/326* (2013.01); *H01L 27/3246* (2013.01); *H01L 27/3258* (2013.01); *H01L 51/5225* (2013.01)

(58) Field of Classification Search
CPC ............. H01L 51/5209; H01L 27/3276; H01L 27/3262; H01L 27/3246; H01L 51/5203; H01L 27/3258; H01L 27/3223; H01L 27/326; H01L 27/3272; H01L 51/5281

See application file for complete search history.

(56) References Cited

U.S. PATENT DOCUMENTS

| | | | |
|---|---|---|---|
| 2007/0132374 A1* | 6/2007 | Park ................... | H01L 27/3253 313/504 |
| 2008/0036949 A1* | 2/2008 | Kim .................. | G02F 1/133555 349/106 |
| 2016/0111487 A1* | 4/2016 | Jeong .................. | H01L 27/3279 257/40 |

(Continued)

FOREIGN PATENT DOCUMENTS

| KR | 10-2003-0029377 A | 4/2003 |
|---|---|---|
| KR | 10-2007-0122380 A | 12/2007 |

(Continued)

*Primary Examiner* — Yasser A Abdelaziez
(74) *Attorney, Agent, or Firm* — Knobbe, Martens, Olson & Bear, LLP (57) ABSTRACT

An organic light-emitting diode (OLED) display is disclosed. In one aspect, the OLED display includes a substrate including a display area configured to display an image and a transmission area positioned on a periphery of the display area, a first insulating layer positioned in the display area and the transmission area and a thin film transistor positioned in the display area and formed on the first insulating layer. The OLED display also includes a second insulating layer positioned in the display area and the transmission area and covering the thin film transistor and an organic light-emitting element positioned in the display area and formed on the second insulating layer. The second insulating layer has a first transmission hole exposing a portion of the first insulating layer on the transmission area, and a spacer is positioned on the first insulating layer in the transmission hole.

20 Claims, 7 Drawing Sheets

(56) References Cited

U.S. PATENT DOCUMENTS

2016/0197131 A1* 7/2016 Park ................... H01L 27/326
                                                              349/139
2016/0233278 A1* 8/2016 Yoon .................. H01L 27/3246
2016/0268356 A1* 9/2016 Go ..................... H01L 27/3248
2016/0300902 A1* 10/2016 You .................... H01L 27/3276

FOREIGN PATENT DOCUMENTS

KR     10-2011-0030209 A     3/2011
KR     10-2014-0088041 A     7/2014

* cited by examiner

ORGANIC LIGHT-EMITTING DIODE DISPLAY

CROSS-REFERENCE TO RELATED APPLICATION

This application claims priority to and the benefit of Korean Patent Application No. 10-2015-0073082 filed in the Korean Intellectual Property Office on May 26, 2015, the entire contents of which are incorporated herein by reference.

BACKGROUND

Field

The described technology generally relates to an organic light-emitting diode display.

Description of the Related Technology

Some currently developed display technologies include a liquid crystal display device (LCD), a plasma display panel device (PDP), an organic light-emitting diode (OLED) display, a field effect display device (FED), and an electrophoretic display device (EPD).

Of particular interest here, an OLED includes two electrodes and an organic emission layer disposed therebetween. Here, electrons from one electrode and holes from the other electrode combine in the organic emission layer to thereby form excitons, which release energy to emit light.

An OLED display has a self-luminous capability, and because it does not need a separate light source (unlike a liquid crystal display), it can have reduced thickness and weight. Further, an OLED display exhibits high-quality characteristics, such as low power consumption, high luminance, and fast response speed, and thus has received attention as a next generation display device.

Recently, a display device in which a transmission area for allowing passage of light is formed at a position adjacent to the organic light-emitting element has been developed. It is recognized as a display device that is entirely transparent.

In this case, to improve transparency, the common electrode is only formed in the display area. However, dark spots are generated (only in the display area) by a fine metal mask used to form the common electrode.

The above information disclosed in this Background section is only to enhance the understanding of the background of the invention, and therefore it may contain information that does not form the prior art that is already known in this country to a person of ordinary skill in the art.

SUMMARY OF CERTAIN INVENTIVE ASPECTS

One inventive aspect relates to a transparent OLED display.

Another aspect is an OLED display that can prevent dark spots from being generated by the fine metal mask in the transparent display device.

Another aspect is an OLED display that includes a substrate including a display area displaying an image and a transmission area positioned on a periphery of the display area; a first insulating layer positioned in the display area and the transmission area and formed on the substrate; a thin film transistor positioned in the display area and formed on the first insulating layer; a second insulating layer positioned in the display area and the transmission area and formed on the first insulating layer to cover the thin film transistor; and an organic light-emitting element positioned in the display area and formed on the second insulating layer to be connected to the thin film transistor, wherein the second insulating layer has a first transmission hole exposing a portion of the first insulating layer on the transmission area, and the spacer is positioned on the first insulating layer in the transmission hole.

The thin film transistor may include a semiconductor layer covered by the first insulating layer; a gate electrode formed on the first insulating layer; and a source electrode and a drain electrode positioned on the gate electrode and connected to the semiconductor layer.

The first insulating layer may include a buffer layer formed on the substrate, and a gate insulating layer formed on the buffer layer and covering the semiconductor layer.

At least one of the buffer layer and the gate insulating layer may include a siloxane-based resin.

The gate insulating layer may be formed of a plurality of layers.

The organic light-emitting element may include a first electrode formed on the second insulating layer and connected to the drain electrode; an organic emission layer positioned on the first electrode; and a second electrode positioned on the organic emission layer, and a pixel definition layer defining the pixel area exposing the portion of the first electrode is formed on the second insulating layer, and the organic emission layer may contact the first electrode in the pixel area.

The second electrode may be positioned only in the display area.

The pixel definition layer may have a second transmission hole exposing the portion of the first insulating layer in the transmission area and positioned corresponding to the first transmission hole.

The spacer may protrude onto the pixel definition layer.

A height of the spacer protruding onto the pixel definition layer may be 1 μm-3 μm.

The spacer may include a first protrusion formed on the first insulating layer and a second protrusion formed on the first protrusion.

The first protrusion may be integrally formed with the second insulating layer.

The second protrusion may be integrally formed with the pixel definition layer.

An interlayer insulating layer formed on the first insulating layer covering the gate electrode may be further included, and the interlayer insulating layer may have a third transmission hole exposing the portion of the first insulating layer in the transmission area and positioned to correspond to the first transmission hole.

An interlayer insulating layer formed on the first insulating layer and covering the gate electrode may be further included, and the portion of the interlayer insulating layer may be exposed through the first transmission hole in the transmission area.

The spacer may be formed in a plurality in the transmission hole.

Another aspect is an organic light emitting diode (OLED) display comprising: a substrate including a display area configured to display an image and a transmission area positioned on a periphery of the display area; a first insulating layer positioned in the display area and the transmission area and formed on the substrate; a thin film transistor positioned in the display area and formed on the first insulating layer; a second insulating layer positioned in the display area and the transmission area and formed on the first insulating layer to cover the thin film transistor; and an organic light-emitting element positioned in the display area and formed on the second insulating layer to be connected to the thin film transistor, wherein the second insulating layer has a first transmission hole exposing a portion of the first insulating layer on the transmission area, and wherein a spacer is positioned on the first insulating layer in the transmission hole.

In the above OLED display, the thin film transistor includes: a semiconductor layer covered by the first insulating layer; a gate electrode formed on the first insulating layer; and a source electrode and a drain electrode positioned on the gate electrode and connected to the semiconductor layer. In the above OLED display, the first insulating layer includes: a buffer layer formed on the substrate; and a gate insulating layer formed on the buffer layer and covering the semiconductor layer.

In the above OLED display, at least one of the buffer layer and the gate insulating layer includes a siloxane-based resin. In the above OLED display, the gate insulating layer comprises a plurality of layers. In the above OLED display, the organic light-emitting element includes: a first electrode formed on the second insulating layer and connected to the drain electrode; an organic emission layer positioned on the first electrode; and a second electrode positioned on the organic emission layer, and wherein a pixel definition layer defining the pixel area exposing a portion of the first electrode is formed on the second insulating layer, and wherein the organic emission layer contacts the first electrode in the pixel area.

In the above OLED display, the second electrode is positioned only in the display area. In the above OLED display, the pixel definition layer has a second transmission hole exposing a portion of the first insulating layer in the transmission area and is positioned to correspond to the first transmission hole. In the above OLED display, the spacer protrudes onto the pixel definition layer. In the above OLED display, the height of the spacer protruding onto the pixel definition layer is about 1 μm-about 3 μm. In the above OLED display, the spacer includes, a first protrusion formed on the first insulating layer; and a second protrusion formed on the first protrusion.

In the above OLED display, the first protrusion is integrally formed with the second insulating layer. In the above OLED display, the second protrusion is integrally formed with the pixel definition layer. The above OLED display further comprises an interlayer insulating layer formed on the first insulating layer covering the gate electrode, wherein the interlayer insulating layer has a third transmission hole exposing a portion of the first insulating layer in the transmission area and positioned to correspond to the first transmission hole. The above OLED display further comprises an interlayer insulating layer formed on the first insulating layer and covering the gate electrode, wherein a portion of the interlayer insulating layer is exposed through the first transmission hole in the transmission area. In the above OLED display, the spacer comprises a plurality of spacers in the transmission hole.

Another aspect is an organic light-emitting diode (OLED) display comprising: a substrate including a display area configured to display an image and a transmission area positioned on a periphery of the display area; a first insulating layer positioned in the display area and the transmission area; a second insulating layer positioned in the display area and the transmission area and formed on the first insulating layer to cover the thin film transistor, wherein the second insulating layer has a first transmission hole exposing a portion of the first insulating layer on the transmission area; and a spacer positioned on the first insulating layer in the transmission hole.

In the above OLED display, the spacer includes: a first protrusion formed on the first insulating layer; and a second protrusion formed on the first protrusion. In the above OLED display, the first protrusion is greater in size than the second protrusion. In the above OLED display, the height of the first protrusion is greater than that of the second protrusion.

According to at least one of the disclosed embodiments, in the process forming the common electrode in the display area, the dark spots may be prevented from being generated by the fine metal mask on the pixel electrode or the pixel definition layer.

DETAILED DESCRIPTION OF CERTAIN INVENTIVE EMBODIMENTS

Hereinafter, the present invention will be described more fully with reference to the accompanying drawings, in which exemplary embodiments of the invention are shown. As those skilled in the art would realize, the described embodiments may be modified in various different ways, all without departing from the spirit or scope. The drawings and description are to be regarded as illustrative in nature and not restrictive. Like reference numerals designate like elements throughout the specification.

Further, in the drawings, the size and thickness of each element are randomly represented for better understanding and ease of description, and the present invention is not limited thereto.

In the drawings, the thickness of layers, films, panels, regions, etc., are exaggerated for clarity. In the drawings, for better understanding and ease of description, the thicknesses of some layers and areas are exaggerated. It will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising", will be understood to imply the inclusion of stated elements but not the exclusion of any other elements. In addition, "~on" is either positioned on or below a portion of a target or positioned on the upper side based on a gravity direction, throughout the specification. In this disclosure, the term "substantially" includes the meanings of completely, almost completely or to any significant degree under some applications and in accordance with those skilled in the art. Moreover, "formed or positioned on" can also mean "formed or positioned over." The term "connected" includes an electrical connection.

Referring to FIG. 1 to FIG. 5, an OLED display 100 according to an exemplary embodiment will be described.

Figure 1:
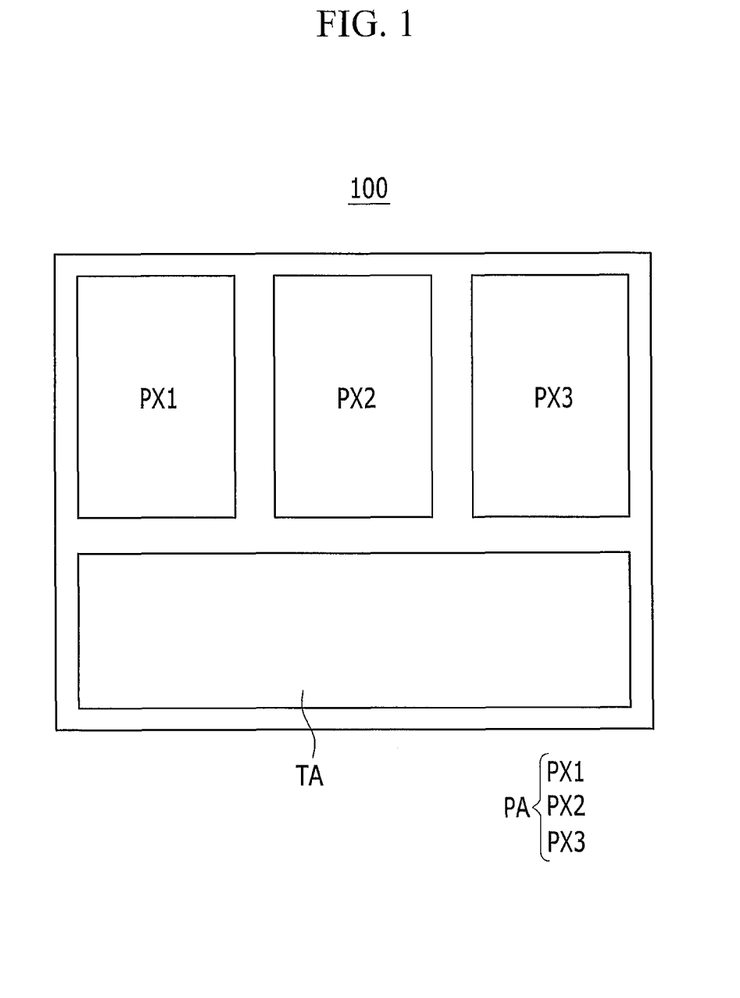
FIG. 1 is a layout view of an OLED display according to an exemplary embodiment.

Referring to FIG. 1, the OLED display 100 is a transparent display device including a display area PA displaying an image and a transmission area TA through which a light is transmitted.

In this case, the display area PA is formed of a plurality of sub-pixels PX1, PX2, and PX3. The sub-pixels PX1, PX2, and PX3 correspond to a plurality of sub-pixels forming one pixel. For example, the sub-pixels PX1, PX2, and PX3 may correspond to a red pixel, a green pixel, and a blue pixel, respectively.

The sub-pixels PX1, PX2, and PX3 include an organic light-emitting element 70, and thin film transistors T1 and T2, respectively.

Also, the transmission area TA corresponds to a region in which the external light is transmitted through a transmission hole 400. By transmitting the external light through the transmission area TA, the transparent display device can be recognized as entirely transparent.

First, one sub-pixel of the display area PA will be described with reference to FIG. 2.

Figure 2:
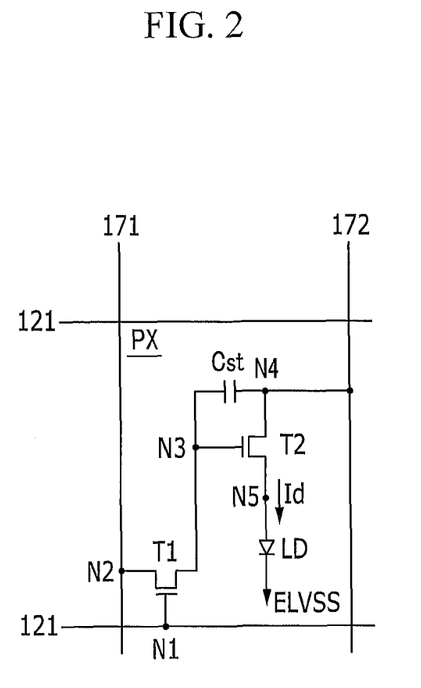
FIG. 2 is an equivalent circuit diagram of one pixel of an OLED display.

Referring to FIG. 2, the OLED display includes a plurality of signal lines 121, 171, and 172, and a pixel PX connected thereto. The pixel PX may be one among the red pixel PX1, the green pixel PX2, and the blue pixel PX3.

The signal lines include gate lines 121 for transmitting a scanning signal, data lines 171 for transmitting a data signal, a driving voltage line 172 for transmitting a driving voltage, and the like.

The gate lines 121 substantially extend in a row direction and are practically parallel to each other, while the data lines 171 substantially extend in a column direction and are substantially parallel to each other. The driving voltage lines 172 are illustrated to substantially extend in the column direction, but they may extend in the row or column direction or have a net-like shape.

In this case, a single subpixel includes a thin film transistor including a switching transistor T1 and a driving transistor T2, a storage capacitor Cst, and an organic light-emitting element LD. Though not illustrated in the drawings, one pixel PX may further include a thin film transistor and a capacitor to compensate for a current that is supplied to the organic light-emitting element LD.

The switching transistor T1 includes a control terminal N1, an input terminal N2, and an output terminal N3. In this case, the control terminal N1 is connected to the gate line 121, the input terminal N2 is connected to the data line 171, and the output terminal N3 is connected to the driving transistor T2.

The switching transistor T1 transmits the data signal transmitted via the data line 171 to the driving transistor T2 in response to the scanning signal transmitted via the gate line 121.

The driving transistor T2 also includes a control terminal N3, an input terminal N4, and an output terminal N5. In this case, the control terminal N3 is connected to the switching transistor T1, the input terminal N4 is connected to the driving voltage line 172, and the output terminal N5 is connected to the organic light-emitting element LD.

The driving transistor T2 outputs an output current Id, an amount of which varies according to a voltage applied between the control terminal N3 and the output terminal N5.

In this case, the capacitor Cst is connected between the control terminal N3 and the input terminal N4 of the driving transistor T2. The capacitor Cst is charged with a data signal applied to the control terminal N3 of the driving transistor T2, and maintains the data signal even after the switching transistor T1 is turned off.

For example, as an OLED, the organic light-emitting element LD has an anode connected to the output terminal N5 of the driving transistor T2 and a cathode connected to a common voltage Vss. The organic light-emitting element LD displays an image by emitting light of varying intensities according to the output current Id of the driving transistor T2.

The organic light-emitting element LD may contain an organic material that represents one or more primary colors, including three of which may be red, green, and blue, and the OLED display displays a desired image with a spatial sum of these colors.

The switching transistor T1 and the driving transistor T2 are n-channel electric effect transistors (FETs), but at least one of them may be a p-channel FET. In addition, a connection relationship between the transistors T1 and T2, the capacitor Cst, and the organic light-emitting element LD may be changed.

Figure 3:
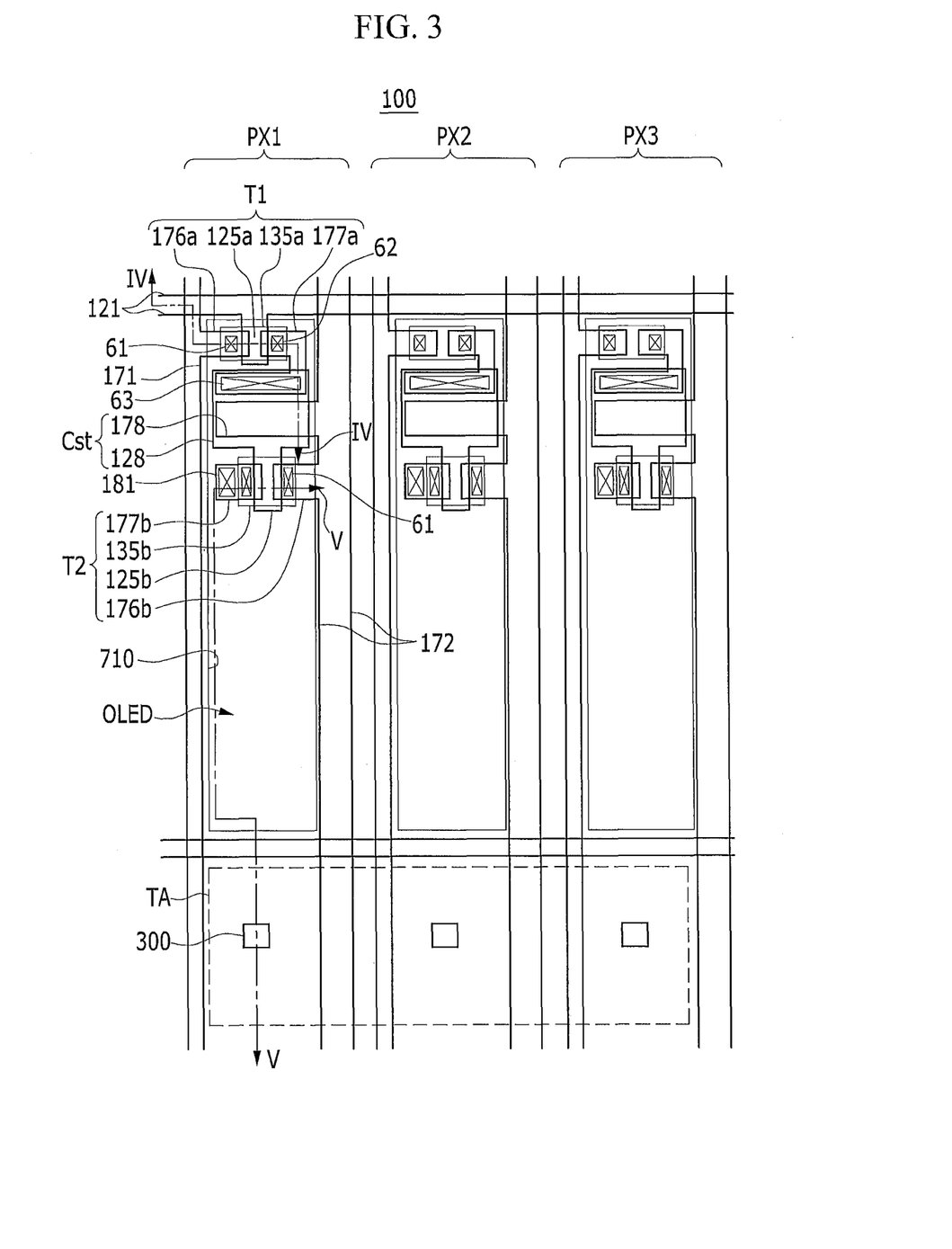
FIG. 3 is a layout view of one pixel of an OLED display according to an exemplary embodiment.
Figure 4:
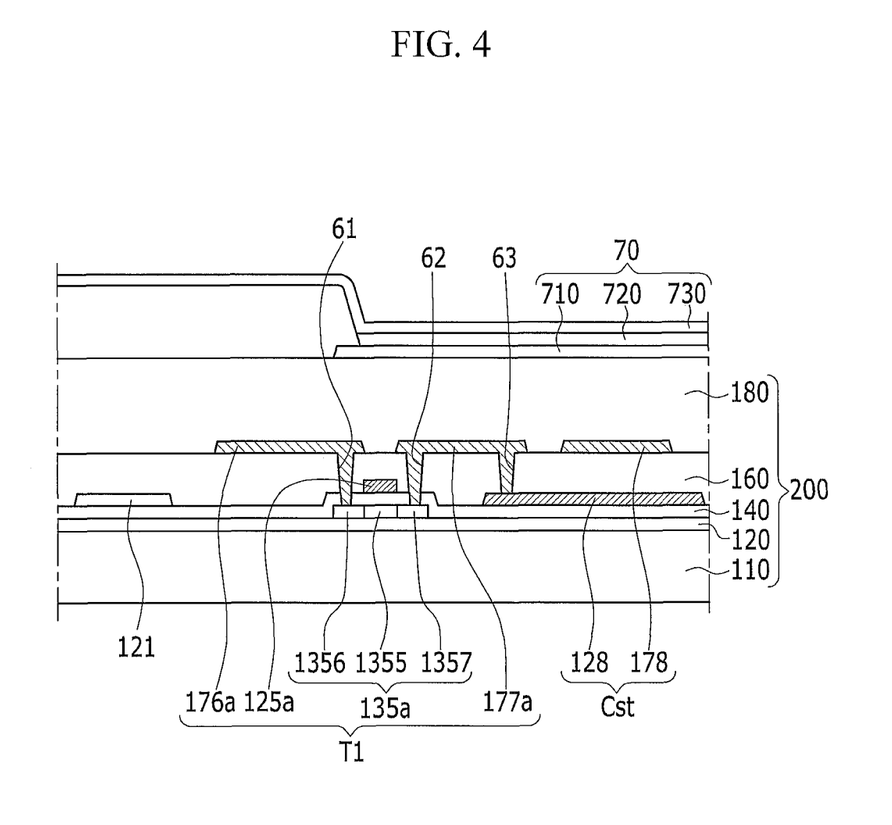
FIG. 4 is a cross-sectional view of the OLED display taken along line IV-IV of FIG. 3.

Next, a structure of the OLED display according to an exemplary embodiment will be described in detail with reference to FIG. 3 to FIG. 5. First, the structure of the display area PA of the OLED display according to the present exemplary embodiment will be described in detail.

The substrate 110 may be formed of an insulating substrate made of glass, quartz, ceramic, or plastic.

Further, a buffer layer 120 is formed on the substrate 110. The buffer layer 120 may be formed as a single layer of a silicon nitride (SiNx) or as a dual-layer in which a silicon nitride (SiNx) and a silicon oxide (SiOx) are laminated. The buffer layer 120 serves to flatten a surface while preventing permeation of unnecessary materials, such as impurities or moisture.

A switching semiconductor layer 135a and a driving semiconductor layer 135b are formed separated from each other on the buffer layer 120.

These semiconductor layers 135a and 135b may be formed of polysilicon or an oxide semiconductor. In this case, the oxide semiconductor may include one oxide based on titanium (Ti), hafnium (Hf), zirconium (Zr), aluminum (Al), tantalum (Ta), germanium (Ge), zinc (Zn), gallium (Ga), tin (Sn), or indium (In), and complex oxides thereof such as zinc oxide (ZnO), indium-gallium-zinc oxide (InGaZnO4), indium-zinc oxide (Zn—In—O), zinc-tin oxide (Zn—Sn—O), indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), and hafnium-indium-zinc oxide (Hf—In—Zn—O).

When the semiconductor layers 135a and 135b are formed of an oxide semiconductor, a separate passivation layer may be added to protect the oxide semiconductor that is vulnerable to an external environment, such as a high temperature and the like.

The semiconductor layers 135a and 135b include a channel region where impurities are not doped, and source and drain regions at opposite sides of the channel region where the impurities are doped. Herein, the impurity is changed according to a kind of transistor, and an N-type impurity or a P-type impurity is feasible.

Each of the switching semiconductor layer 135a and the driving semiconductor layer 135b is divided into a channel region 1355, and a source region 1356 and a drain region 1357, which are formed at both sides of the channel region 1355.

The channel region 1355 of the switching semiconductor layer 135a and the driving semiconductor layer 135b may include polysilicon on which impurities are not doped, that is, an intrinsic semiconductor.

In addition, the source region 1356 and the drain region 1357 of the switching semiconductor layer 135a and the driving semiconductor layer 135b may include polysilicon on which conductive impurities are doped, that is, an impurity semiconductor.

A gate insulating layer 140 is formed on the switching semiconductor layer 135a and the driving semiconductor layer 135b. The gate insulating layer 140 may be a single layer or a multilayer including at least one of silicon nitride and silicon oxide.

In this case, the buffer layer 120 and the gate insulating layer 140 may be formed together in the transmission area TA as well as the display area PA. Hereafter, in the specification, the buffer layer 120 and the gate insulating layer 140 may be described as one first insulating layer.

A gate line 121a, a driving gate electrode 125a, and a first capacitor electrode 128 are formed on the gate insulating layer 140.

The gate line 121 extends in a horizontal direction to transfer a scan signal to the switching transistor T1. In this case, the gate line 121 includes a switching gate electrode 125a protruding to the switching semiconductor layer 135a.

The driving gate electrode 125b protrudes from the first capacitor electrode 128 to the driving semiconductor layer 135b. Each of the switching gate electrode 125a and driving gate electrode 125b overlaps the channel region 1355.

Meanwhile, an interlayer insulating layer 160 is formed on the gate line 121, the driving gate electrode 125b, and the first capacitor electrode 128. Like the gate insulating layer 140, the interlayer insulating layer 160 may be made of silicon nitride, silicon oxide, or the like.

In the interlayer insulating layer 160 and the gate insulating layer 140, a source contact hole 61 and a drain contact hole 62 respectively exposing the source region 1356 and the drain region 1357 are formed, and a storage contact hole 63 exposing a part of the first capacitor electrode 128 is formed.

On the interlayer insulating layer 160, a data line 171 having a switching source electrode 176a, a driving voltage line 172 having a driving source electrode 176b and a second storage capacitor 178, and a switching drain electrode 177a and a driving drain electrode 177b connected to the first capacitor electrode 128 are formed.

The data line 171 transfers a data signal and extends in a direction to cross the gate line 121. The driving voltage line 172 transfers a driving voltage and is separated from the data line 171 to extend in the same direction as the data line 171.

The switching source electrode 176a protrudes toward the switching semiconductor layer 135a from the data line 171, and the driving source electrode 176b protrudes toward the driving semiconductor layer 135b from the driving voltage line 172.

Each of the switching source electrode 176a and the driving source electrode 176b is connected to the source region 1356 through the source contact hole 61. The switching drain electrode 177a faces the switching source electrode 176a, and the driving drain electrode 177b faces the driving source electrode 176b.

In addition, each of the switching drain electrode 177a and the driving drain electrode 177b is connected to the drain region 1357 through the drain contact hole 62.

The switching drain electrode 177a is extended to be electrically connected to the first capacitor electrode 128 and the driving gate electrode 125b through the contact hole 63 formed in the interlayer insulating layer 160.

The second capacitor electrode 178 protrudes from the driving voltage line 172 to overlap the first capacitor electrode 128. Accordingly, the first capacitor electrode 128 and the second capacitor electrode 178 form the storage capacitor Cst by using the interlayer insulating layer 160 as a dielectric material.

The switching semiconductor layer 135a, the switching gate electrode 125a, the switching source electrode 176a, and the switching drain electrode 177a form the switching transistor T1. Meanwhile, the driving semiconductor layer 135b, the driving gate electrode 125a, the driving source electrode 176b, and the driving drain electrode 177b form the driving transistor T2.

The switching transistor T1 and the driving transistor T2 correspond to switching elements. According to the present exemplary embodiment, the switching and the driving thin film transistors T1 and T2 are formed in the display area PA of the OLED display.

A planarization layer 180 is formed on the switching source electrode 176a, the driving source electrode 176b, the switching drain electrode 177a, and the driving drain electrode 177b. The planarization layer 180 removes a step and serves to planarize in order to increase light emission efficiency of the organic light-emitting element. The planarization layer 180 is described as a second insulating layer.

The planarization layer 180 may include at least one material of a polyacrylate resin, an epoxy resin, a phenolic resin, a polyamide resin, a polyimide resin, an unsaturated polyester resin, a poly phenylenether resin, a poly phenylenesulfide resin, a siloxane-based resin, and a silica-based inorganic material.

A pixel electrode 710 is formed on the planarization layer 180. The pixel electrode 710 is formed on the passivation layer 180 and the pixel electrode 710 may be made of transparent conductive materials, such as, indium tin oxide (ITO), indium zinc oxide (IZO), zinc oxide (ZnO) or indium oxide (In2O3) or reflective metals such as lithium (Li), calcium (Ca), lithium fluoride/calcium (LiF/Ca), lithium fluoride/aluminum(LiF/Al), aluminum (Al), silver (Ag), magnesium (Mg), or gold (Au).

The pixel electrode 710 is electrically connected to the driving drain electrode 177b of the driving transistor T1 through a contact hole 181 formed on the interlayer insulating layer 160, and thus becomes an anode of an OLED 70.

A pixel definition layer 350 is formed on the planarization layer 180 and the edge of the pixel electrode 710. The pixel definition layer 350 has an opening exposing the pixel electrode 71.

The pixel definition layer 350 may be made of resin, such as polyacrylates or polyimides, silica-based inorganic materials, and the like.

An organic emission layer 720 is formed in the opening of the pixel definition layer 350. The organic light-emitting layer is formed of a plurality of layers which include at least one of a light-emitting layer, a hole-injection layer (HIL), a hole-transporting layer (HTL), an electron-transporting layer (ETL), and an electron-injection layer (EIL).

When the organic light-emitting layer 720 includes all of them, the hole injection layer is disposed on the pixel electrode 710 which is the anode and the hole transport layer, the light-emitting layer, the electron transport layer, and the electron injection layer may be sequentially stacked thereon.

The organic light-emitting layer 720 may include a red organic light-emitting layer which emits red light, a green organic light-emitting layer which emits green light, and a blue organic light-emitting layer which emits blue light, in which the red organic light-emitting layer, the green organic light-emitting layer, and the blue organic light-emitting layer are each formed in a red pixel, a green pixel, and a blue pixel to implement a color image.

Further, the organic light-emitting layer 720 may implement the color image by stacking the red organic light-emitting layer, the green organic light-emitting layer, and the blue organic light-emitting layer in each of the red pixel, the green pixel, and the blue pixel and forming a red filter, a green filter, and a blue filter for each pixel.

As another example, the color image is implemented by forming a white organic light-emitting layer which emits white light in each of the red pixel, the green pixel, and the blue pixel and forming the red filter, the green filter, and the blue filter for each pixel. At the time of implementing the color image using the white organic light-emitting layer and the color filters, there is no need to use a deposition mask for depositing the red organic light-emitting layer, the green organic light-emitting layer, and the blue organic light-emitting layer on each pixel, that is, the red pixel, the green pixel, and the blue pixel.

The white organic light-emitting layer described in another example may be formed of a single organic light-emitting layer and may be configured to emit white light by stacking the organic light-emitting layers. For example, the white organic light-emitting layer may also include a configuration to emit white light by combining at least one yellow organic light-emitting layer with at least one blue organic light-emitting layer, a configuration to emit white light by combining at least one cyan organic light-emitting layer with at least one red organic light-emitting layer, and a configuration to emit white light by combining at least one magenta organic light-emitting layer with at least one green organic light-emitting layer, and the like.

A common electrode 730 is formed on the pixel definition layer 350 and the organic emission layer 720. The common electrode 730 may be made of transparent conductive materials, such as indium tin oxide (ITO), indium zinc oxide (IZO), zinc oxide (ZnO), and indium oxide (In2O3), or reflective metals, such as lithium (Li), calcium (Ca), lithium fluoride/calcium (LiF/Ca), lithium fluoride/aluminum(LiF/Al), aluminum (Al), silver (Ag), magnesium (Mg), and gold (Au).

The common electrode 730 becomes a cathode of the OLED 70. As such, the pixel electrode 710, the organic emission layer 720, and the common electrode 730 form the OLED 70.

Figure 5:
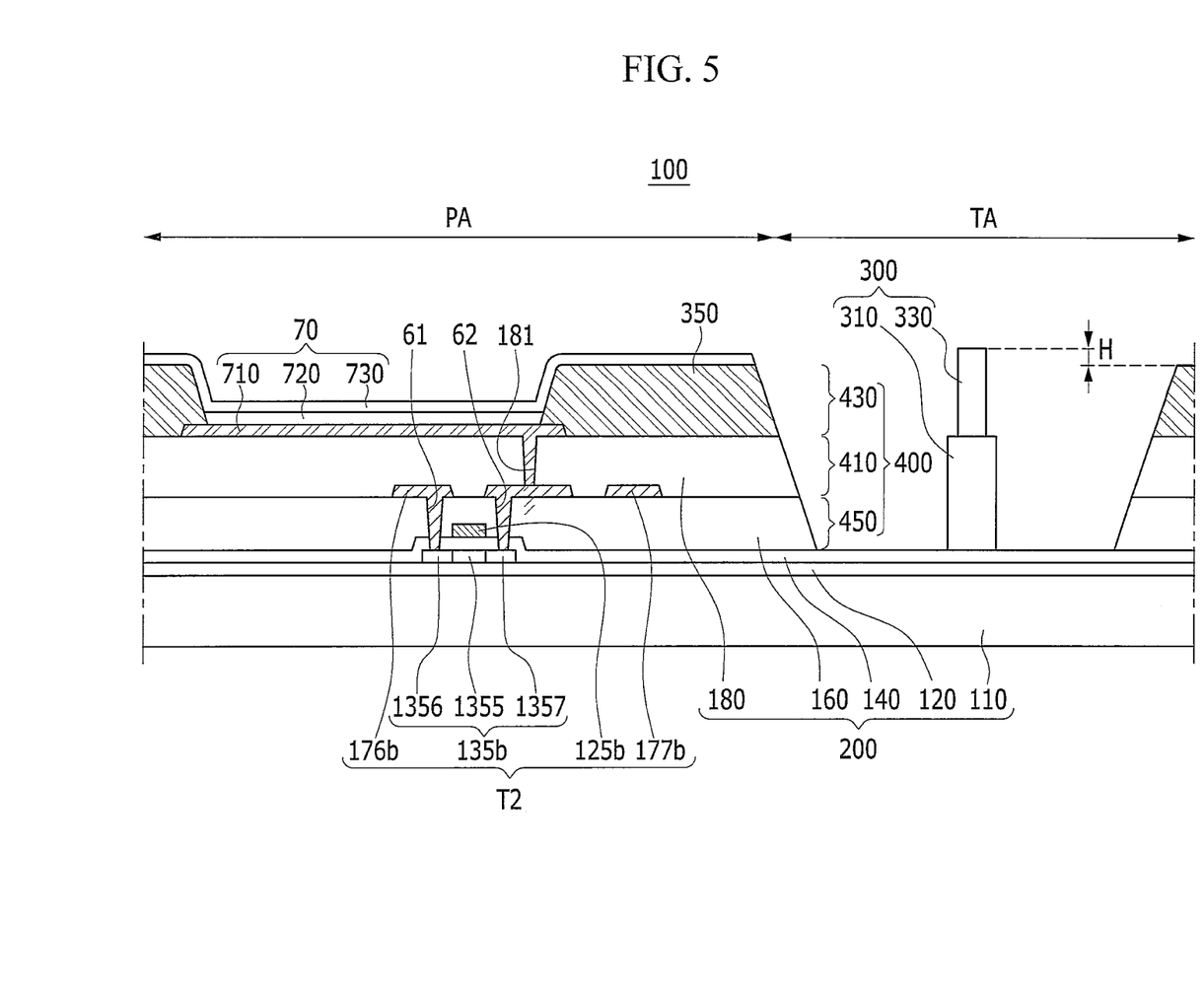
FIG. 5 is a cross-sectional view of the OLED display taken along line V-V of FIG. 3.

Referring to FIG. 5, in the present exemplary embodiment, the common electrode 730 is only formed in the display area PA. That is, the common electrode 730 is not formed in the transmission area TA. As described above, if the common electrode 730 is only formed in the display area PA, light is prevented from being reflected or absorbed by the common electrode 730, thereby also improving the transparency of the transparent display device.

On the other hand, an overcoat (not shown) protecting the organic light-emitting element 70 may be formed on the common electrode 730.

Referring to FIG. 5, a transmission hole 400 is formed in the transmission area TA. As described above, by passing the external light through the transmission hole 400, the OLED display can be recognized as a transparent display device.

In this case, the transmission hole 400 may be formed to penetrate the interlayer insulating layer 160, the planarization layer 180, and the pixel definition layer 350 in the transmission area TA. Here, the transmission hole 400 includes first to third transmission holes 410, 430, and 450, the first transmission hole 410 may be formed in the planarization layer 180, the second transmission hole 430 may be formed in the pixel definition layer 350, and the third transmission hole 450 may be formed in the interlayer insulating layer 160.

In the transmission area TA, the portion of the first insulating layer may be exposed through the transmission hole 400. For example, the gate insulating layer 140 is exposed through the transmission hole 400.

According to an exemplary embodiment, a spacer 300 is formed in the transmission hole 400. The spacer 300 may protrude on the gate insulating layer 140. In the manufacturing process of the OLED display, the spacer 300 may support a fine metal mask (FMM) used for forming the common electrode 730 in the display area PA.

Figure 7:
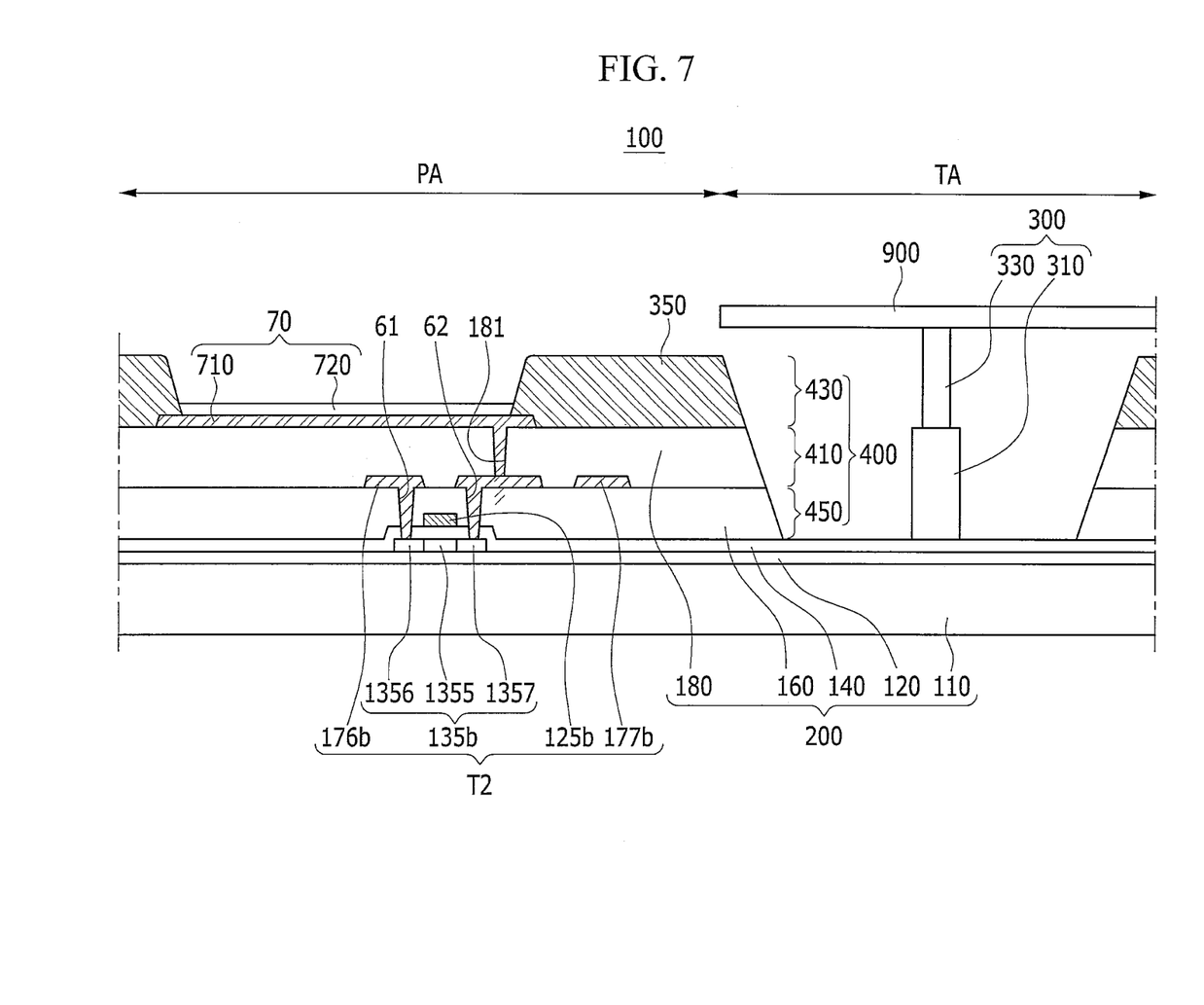
FIG. 7 is a view showing a process forming a common electrode by using a mask.

FIG. 7 is a view showing a process for forming a common electrode by using a mask.

Referring to FIG. 7, to form the common electrode 730 in only the display area PA, the fine metal mask 900 formed with an opening at the position corresponding to the display area PA is positioned on the substrate 110. Then, a material for forming the common electrode 730 is coated to form the common electrode 730 in only the display area PA, as shown in FIG. 5.

However, the metal mask 900 may cause sagging due to its own weight. Accordingly, a portion of the fine metal mask (FMM) contacts a portion of the pixel electrode 710 and the pixel definition layer 350, thereby generating marks imprinted by the pixel electrode 710, i.e., dark spots.

According to an exemplary embodiment, to prevent the dark spots from being generated by the fine metal mask 900, the spacer 300 is formed in the transmission hole 400 of the transmission area TA.

In this case, the spacer 300 may be formed to protrude on the pixel definition layer 350. To maintain the fine metal mask 900 and the pixel definition layer 350 with a predetermined interval, the spacer 300 can protrude on the pixel definition layer 350. In this case, a height H that the spacer 300 protrudes from the pixel definition layer 350 may be about 1 μm-about 3 μm.

On the other hand, a plurality of spacers 300 may be formed in the transmission hole 400. In FIG. 5, one spacer 300 is formed in the transmission hole 400, however the present invention is not limited thereto and a plurality of spacers 300 may be formed.

An amount of sagging generated in the fine metal mask FMM may be different depending on a material, a size, a thickness, and a weight of the fine metal mask (FMM) used in the manufacturing process of the OLED display. Accordingly, by controlling the number of spacers 300, the amount of sagging of the fine metal mask (FMM) may be controlled. For example, when the size or the weight of the fine metal mask (FMM) is large, the amount of sagging of the fine metal mask (FMM) may be reduced by increasing the number of spacers 300 or by providing a larger spacer. Also, if a plurality of spacers 300 is formed, the height H of the spacers 300 protruding from the pixel definition layer 350 may be reduced.

Referring to FIG. 5, the spacer 300 includes first and second protrusions 310 and 330. The first protrusion 310 may be formed of a shape protruding on the gate insulating layer 140. Further, the second protrusion 330 may be formed of a shape protruding on the first protrusion 310. The first protrusion 310 can be greater in size than the second protrusion 330. The height of the first protrusion 310 can be greater than that of the second protrusion 330.

In this case, the first protrusion 310 may be integrally formed with the planarization layer 180. That is, the first protrusion 310 may be simultaneously or concurrently formed with the planarization layer 180 in the process for forming the planarization layer 180.

Accordingly, the first protrusion 310 may be formed of the same material as the planarization layer 180. For example, the first protrusion 310 may be a polyacrylate resin, an epoxy resin, a phenolic resin, a polyamide resin, a polyimide resin, an unsaturated polyester resin, a poly phenylenether resin, a poly phenylenesulfide resin, a siloxane-based resin, and a silica-based inorganic material. For example, the first protrusion 310 is formed of the siloxane-based resin.

If the spacer 300 is formed in the transmission hole 400 of the transmission area TA, the amount of light transmitted to the transmission area TA may be reduced. Accordingly, transparency of the transparent display device may be also reduced. To prevent the reduction of transparency due to the spacer 300, the first protrusion 310 configuring the spacer 300 can be formed of the siloxane-based resin having high transmittance.

On the other hand, the second protrusion 330 may be integrally formed with the pixel definition layer 350. That is, the second protrusion 330 may be simultaneously or concurrently formed with the pixel definition layer 350 in the process for forming the pixel definition layer 350.

Accordingly, the second protrusion 330 may be formed of the same material as the pixel definition layer 350. For example, the second protrusion 330 may be a resin such as polyamide, polyacrylates, or polyimides, siloxane-based resin, silica-based inorganic material. Particularly, the second protrusion 330 may be formed of the siloxane-based resin.

As described above, to prevent the reduction of the transparency of the transparent display device due to the spacer 300, the second protrusion 330 configuring the spacer 300 can be formed of the siloxane-based resin having high transmissivity.

Next, the OLED display according to another exemplary embodiment will be described with reference to FIG. 6. In the description of the OLED display according to another exemplary embodiment, a detailed description of the same or similar configurations of the OLED display as in the exemplary embodiment will be omitted.

Figure 6:
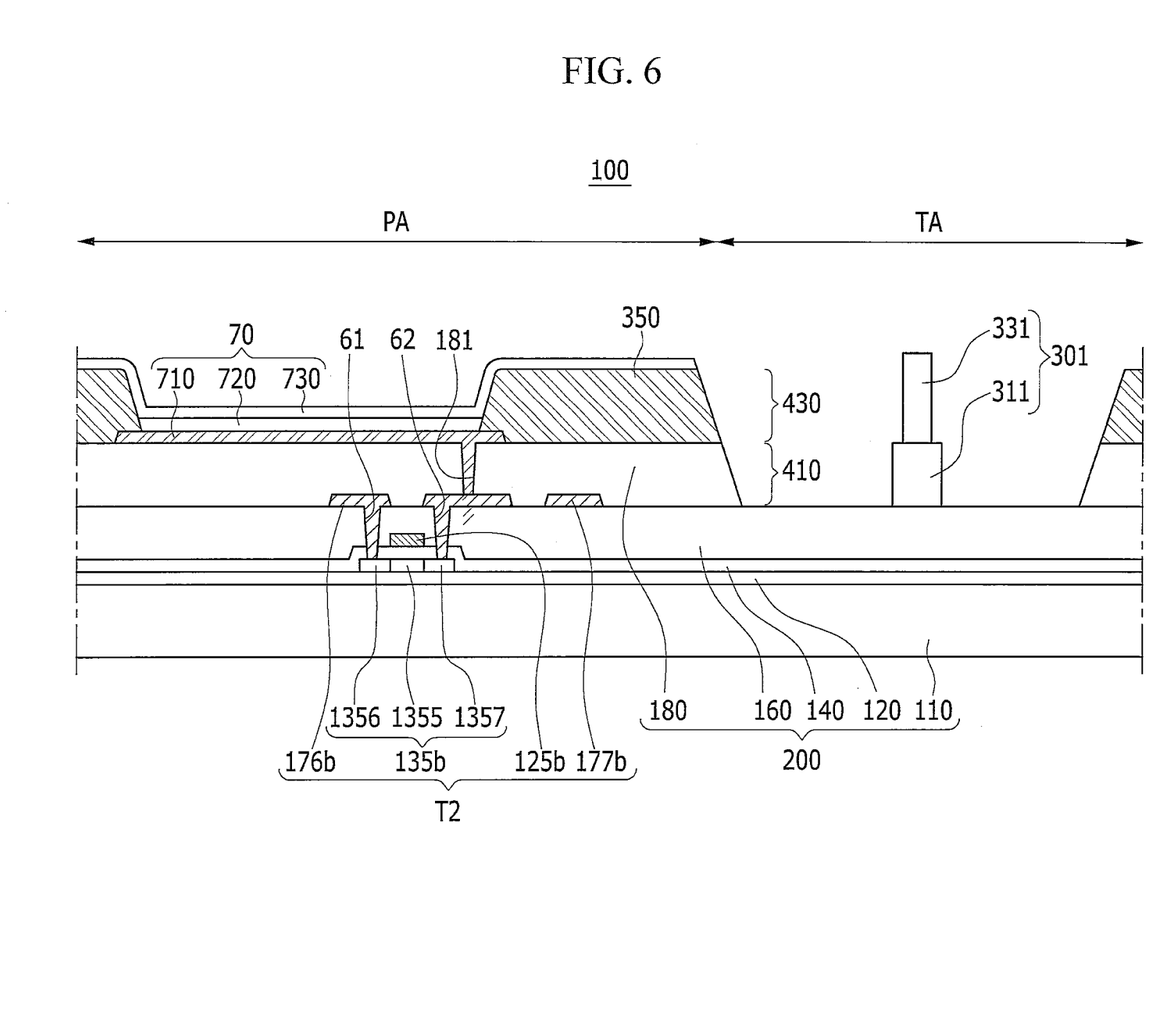
FIG. 6 is a cross-sectional view of the OLED display taken along line V-V of FIG. 3 according to another exemplary embodiment.

Referring to FIG. 6, in the OLED display according to another exemplary embodiment, the transmission hole is formed in the interlayer insulating layer 160 in the transmission area TA. That is, differently from FIG. 5, the interlayer insulating layer 160 covers the gate insulating layer 140 in the transmission area TA.

As a result, in the present exemplary embodiment, the portion of the interlayer insulating layer 160 may be exposed by the transmission hole 400.

On the other hand, the spacer 301 may be formed in the transmission hole 400 of the transmission area TA. The spacer 301 may be formed to protrude on the interlayer insulating layer 160. According to the present exemplary embodiment, the spacer 301 may be made of first and second protrusions 311 and 331. The first protrusion 311 may be formed of a protruding shape on the gate insulating layer 140. Further, the second protrusion 331 may be formed of a protruding shape on the first protrusion 311.

In this case, the first protrusion 311 may be integrally formed with the planarization layer 180. That is, the first protrusion 311 may be simultaneously formed with the planarization layer 180 in the process for forming the planarization layer 180.

Accordingly, the first protrusion 311 may be formed of the same material as the planarization layer 180. For example, the first protrusion 311 may include at least one material of a polyacrylate resin, an epoxy resin, a phenolic resin, a polyamide resin, a polyimide resin, an unsaturated polyester resin, a poly phenylenether resin, a poly phenylenesulfide resin, a siloxane-based resin, and a silica-based inorganic material. For example, the first protrusion 311 is formed of the siloxane-based resin.

If the spacer 301 is formed in the transmission hole 400 of the transmission area TA, the amount of light transmitted to the transmission area TA may be reduced. Accordingly, the transparency of the transparent display device may also be reduced. To prevent the reduction of the transparency due to the spacer 301, the first protrusion 311 configuring the spacer 301 can be formed of the siloxane-based resin having high transmissivity.

On the other hand, the second protrusion 331 may be integrally formed with the pixel definition layer 350. That is, the second protrusion 331 may be simultaneously or concurrently formed of the pixel definition layer 350 in the process for forming the pixel definition layer 350.

Accordingly, the second protrusion 331 may be formed of the same material as the pixel definition layer 350. For example, the second protrusion 331 may be the polyamide, the resin based on polyacrylates or polyimides, the siloxane-based resin, and the silica-based inorganic material. For example, the second protrusion 331 is formed of the siloxane-based resin.

As described above, to prevent the reduction of the transparency of the transparent display device due to the spacer 301, the second protrusion 331 configuring the spacer 301 can be formed of the siloxane-based resin having high transmissivity.

According to an exemplary embodiment, the spacer 300 is formed in the transmission hole 400 of the transmission area TA. The spacer 300 supports the fine metal mask 900 in the manufacturing process, thereby dark spots may be prevented from being generated in the display device by the fine metal mask 900 in the manufacturing process.

While the inventive technology has been described in connection with exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode (OLED) display comprising:
    a substrate including a display area configured to display an image and a transmission area positioned on a periphery of the display area;
    a first insulating layer positioned in the display area and the transmission area and formed on the substrate;
    a thin film transistor positioned in the display area and formed on the substrate;
    a second insulating layer positioned in the display area and the transmission area and formed on the first insulating layer to cover the thin film transistor; and
    an organic light-emitting element disposed on the display area and formed on the second insulating layer to be connected to the thin film transistor,
    wherein the second insulating layer has a first transmission hole exposing a portion of the first insulating layer on the transmission area, and
    wherein a spacer is positioned on the first insulating layer in the transmission hole.

2. The OLED display of claim 1, wherein the thin film transistor includes:
    a semiconductor layer covered by the first insulating layer;
    a gate electrode formed on the first insulating layer; and
    a source electrode and a drain electrode positioned on the gate electrode and connected to the semiconductor layer.

3. The OLED display of claim 2, wherein the first insulating layer includes:
    a buffer layer formed on the substrate; and
    a gate insulating layer formed on the buffer layer and covering the semiconductor layer.

4. The OLED display of claim 3, wherein at least one of the buffer layer and the gate insulating layer includes a siloxane-based resin.

5. The OLED display of claim 3, wherein the gate insulating layer comprises a plurality of layers.

6. The OLED display of claim 2, wherein the organic light-emitting element includes:
    a first electrode formed on the second insulating layer and connected to the drain electrode;
    an organic emission layer positioned on the first electrode; and
    a second electrode positioned on the organic emission layer, and
    wherein a pixel definition layer defining the pixel area exposing a portion of the first electrode is formed on the second insulating layer, and
    wherein the organic emission layer contacts the first electrode in the pixel area.

7. The OLED display of claim 6, wherein the second electrode is positioned only in the display area.

8. The OLED display of claim 6, wherein the pixel definition layer has a second transmission hole exposing a portion of the first insulating layer in the transmission area and is positioned to correspond to the first transmission hole.

9. The OLED display of claim 6, wherein the spacer protrudes onto the pixel definition layer.

10. The OLED display of claim 6, wherein: the height of the spacer protruding onto the pixel definition layer is about 1 µm-about 3 µm.

11. The OLED display of claim 6, wherein the spacer includes,
    a first protrusion formed on the first insulating layer; and
    a second protrusion formed on the first protrusion.

12. The OLED display of claim 11, wherein the first protrusion is integrally formed with the second insulating layer.

13. The OLED display of claim 12, wherein the second protrusion is integrally formed with the pixel definition layer.

14. The OLED display of claim 6, further comprising an interlayer insulating layer formed on the first insulating layer covering the gate electrode, wherein the interlayer insulating layer has a third transmission hole exposing a portion of the first insulating layer in the transmission area and positioned to correspond to the first transmission hole.

15. The OLED display of claim 6, further comprising an interlayer insulating layer formed on the first insulating layer and covering the gate electrode, wherein a portion of the interlayer insulating layer is exposed through the first transmission hole in the transmission area.

16. The OLED display of claim 1, wherein the spacer comprises a plurality of spacers in the transmission hole.

17. An organic light-emitting diode (OLED) display comprising:
    a substrate including a display area configured to display an image and a transmission area positioned on a periphery of the display area;
    a first insulating layer positioned in the display area and the transmission area;
    a second insulating layer positioned in the display area and the transmission area and formed on the first insulating layer, wherein the second insulating layer has a first transmission hole exposing a portion of the first insulating layer on the transmission area; and
    a spacer positioned on the first insulating layer in the transmission hole.

18. The OLED display of claim 17, wherein the spacer includes:
    a first protrusion formed on the first insulating layer; and
    a second protrusion formed on the first protrusion.

19. The OLED display of claim 18, wherein the first protrusion is greater in size than the second protrusion.

20. The OLED display of claim 18, wherein the height of the first protrusion is greater than that of the second protrusion.

* * * * *